United States Patent [19]
Braun

[11] Patent Number: 4,554,511
[45] Date of Patent: Nov. 19, 1985

[54] OFFSET VOLTAGE CORRECTION NETWORK FOR INSTANTANEOUS FLOATING POINT AMPLIFIER

[75] Inventor: Steve W. Braun, San Diego, Calif.

[73] Assignee: Tetra Tech, Inc., Pasadena, Calif.

[21] Appl. No.: 427,489

[22] Filed: Sep. 29, 1982

[51] Int. Cl.⁴ .................. H03F 1/02; H03F 3/217; H03F 3/45; H03G 3/20
[52] U.S. Cl. .................................... 330/9; 330/129
[58] Field of Search .................. 370/97; 364/480, 481; 330/88, 98, 252, 254, 9, 129

[56] References Cited

U.S. PATENT DOCUMENTS

| | | | |
|---|---|---|---|
| 3,265,980 | 8/1966 | Thompson | 330/98 |
| 3,590,380 | 6/1971 | Zegers et al. | 370/97 |
| 3,863,173 | 1/1975 | Scheib et al. | 330/98 |
| 4,074,201 | 2/1978 | Lennon | 364/481 |
| 4,104,596 | 8/1978 | Smither | 330/9 |
| 4,124,818 | 11/1978 | Lin et al. | 364/481 |
| 4,158,819 | 6/1979 | Smither | 330/9 |
| 4,217,645 | 8/1980 | Barry et al. | 364/481 |
| 4,255,792 | 3/1981 | Das | 364/481 |
| 4,357,577 | 11/1982 | Smither | 330/9 |
| 4,414,638 | 11/1983 | Talambiras | 364/481 |

Primary Examiner—Douglas W. Olms
Assistant Examiner—Wellington Chin
Attorney, Agent, or Firm—William T. Udseth

[57] ABSTRACT

Disclosed is an instantaneous floating point amplifier which continuously generates an offset correction voltage level for each possible gain word controlling an internal cascaded amplifier. The offset voltage levels are digitized and stored until an input data signal is received. A portion of the output analog-to-digital converter system for the floating point amplifier is utilized on a time sharing basis to regenerate an analog offset correction voltage. The offset correction voltage is input into a summing network inserted into the amplifier circuit between internal preamplifier and amplifier components. When the input signal has been grounded, the offset correction voltage is disconnected from the input summing network and the floating point amplifier is cycled through its gain operations.

26 Claims, 1 Drawing Figure

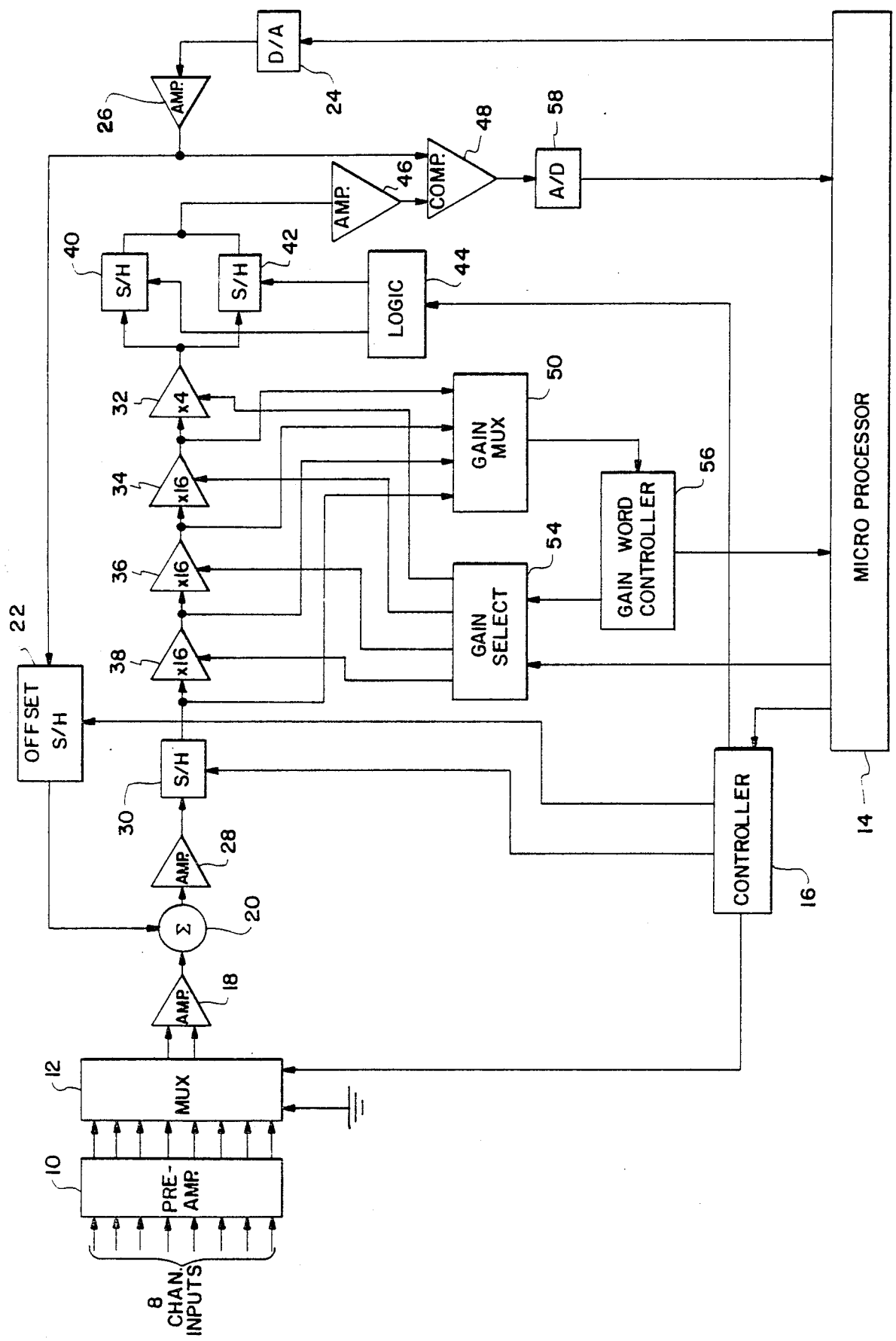

OFFSET VOLTAGE CORRECTION NETWORK FOR INSTANTANEOUS FLOATING POINT AMPLIFIER

BACKGROUND OF THE INVENTION

1. Field of the Invention

The present invention relates generaly to an instantaneous floating point amplifier and particularly to such an amplifier which includes offset voltage correction data processing capabilities.

2. Description of the Prior Art

A seismic receiver employs an instantaneous floating point (IFP) amplifier because of the tremendous dynamic range requirements in which it is used. That is, a near-channel signal is proportionally much stronger than a far-channel signal with the signals from the seismic detectors having various amplitudes in between. Therefore, the gain for the amplifier with a near-channel signal must be much lower than the gain for the same amplifier when employed with a relatively weak far-channel signal. It has been common practice to use a plurality of cascaded amplifier stages for the basis of developing two parts of a composite representation each time a signal is amplitude sampled and that amplitude is digitized.

First, the signal is applied to a sample-and-hold network, the output therefrom being sequentially test sampled for amplitude with different combinations of amplifiers until a given combination is reached that is greater than a predetermined threshold level. Each time a new combination of amplifiers is attempted, a digital gain word is developed for that combinatin. When the threshold level is exceeded in the sequential test sample sequence, the gain word is stored. The amplified value corresponding to this gain word, which is actually a multiplier factor, is applied to an output network as the analog mantissa value. The mantissa value is then digitized and processed in time coincidence with its related gain word as representative of the total value.

Because of the wide dynamic range of the amplifiers, as well as the thermal environmental operating conditions, there is an offset voltage that is inherent in the IFP. Furthermore, the offset voltage tends to change over a period of time as the amplifier heats up or cools down and for other reasons. The offset signal appears as a dc voltage superimposed on the analog data voltage and it can be substantial, in fact, having an even larger order of magnitude than a weak data signal. The prior art techniques for removing or compensating for the dc offset have mainly included filters. One technique that has been employed involves the measuring of the dc offset independently of signal, converting the value of dc offset to a digital value, shifting the developed two-part digitized data into a register and digitally correcting the data in the register by the digital offset voltage value. This is sometimes referred to as altering or "normalizing" the data. Although this technique accomplishes the desired results, the operation uses a large number of electronic components.

It is therefore, a feature of the present invention to provide improved offset voltage correction data processing in an instantaneous floating point amplifier without using a large number of digital logic components to perform the calculation.

It is another feature of the present invention to provide improved offset voltage correction data processing in an instantaneous floating point amplifier by determining the offset voltage correction utilizing components used for other operational purposes that are part of the analog-to-digital output network of the amplifier.

SUMMARY OF THE INVENTION

The instantaneous floating point amplifier which is disclosed herein includes a cascaded amplifier preceded by a sample-and-hold network in normal fashion. Immediately preceding the sample-and-hold network, however, is a summing network to which the input data is applied from the input multiplexer. The summing network also has an analog offset correction voltage applied thereto in such a manner so as to subtract the offset component from the input data as it is applied. This offset voltage is derived from a digital-to-analog device to which a digitally stored value of dc offset is applied. The digital-to-analog device that accomplishes this operation is a portion of the output analog-to-digital converter system for the floating point amplifier. The dc offset voltage development and its conversion and application to the summing network utilizes the digital-to-analog device on a time sharing basis.

The offset voltage is developed for each possible gain word of the floating point amplifier, since each word uses a different combination of individual amplifiers and each one has a related offset value. The multiplexer input is cycled not only through the input channels, but to select a grounded input for the floating point amplifier. While the input is grounded and the offset voltage is disconnected from the input summing network, the floating point amplifier is cycled through its gain operations while developing an offset value for each one. These values are then stored so that when a channel input is selected having a data signal amplitude with a particular value requiring a selected one of the possible gain words, the proper offset voltage corresponding to this gain word will be digitally substracted, and one offset voltage corresponding to one of the gain words is applied to the summing network.

The offset voltages that are introduced in the preamplifier can also be corrected by determining an average offset value and then combined in the storage device with the offset values developed for the amplifier stages, as just discussed, so that when an offset value is selected, it corrects for all offset values resulting from the components being used for a data signal of a particular amplitude, both those offset values resulting in the preamplifier and in the amplifier.

BRIEF DESCRIPTION OF THE DRAWINGS

So that the manner in which the above-recited features, advantages and objects of the invention, as well a others which will become apparent are attained and can be understood in detail, more particular description of the invention briefly summarized above may be had by reference to the embodiment thereof which is illustrated in the drawing, which drawing forms a part of this specification. It is to be noted, however, that the appended drawing illustrates only a typical embodiment of the invention and is therefore not to be considered limiting of its scope, for the invention may admit to other equally effective embodiments.

IN THE DRAWINGS:

The FIGURE is a block diagram of the components in the instantaneous floating point amplifier portion of the present invention.

DESCRIPTION OF THE PREFERRED EMBODIMENTS

Now referring to the drawing, eight channels of data input combined in the input data stream are shown applied to preamplifier 10 and from there to multiplexer 12. The multiplexer is cycled through the selection of channels in sequential fashion in accordance with the description by microprocessor 14 and controller 16. The output of multiplexer 12 is applied to isolation amplifier 18, the output of which is applied to summing or summation network 20. Summation network 20 has connected to it a second input from offset sample-and-hold network 22. The input to network 22 is from a storage element in microprocessor 14 which is converted to an analog value in digital-to-analog converter 24 and amplified in isolation amplifier 26. This event occurs in operational coincidence with the application of the selected data signal to summation network 20.

The output from offset sample-and-hold network 22 is in opposition to the offset value that exists on the analog data signal applied to the summation network and, therefore, the offset is effectively subtracted from the data so that only the data signal is applied from summation network 20 to amplifier 28. An inverter network (not shown) can be used in either the input or the output to network 22 for this purpose.

The output of amplifier 28 is applied to sample-and-hold device 30 while the cascaded amplifiers in the floating point amplifier perform their operation to determine the gain word for the applied signal and the remaining mantissa analog value therefor. Typically, amplifiers are connected into the data signal path to apply dB gain successively as follows: 0, 12, 24, 36, 48, 60, 72, and 84. These decibel gains are accomplished by amplifying the input signal successively in a unity gain amplifier, a times 4 amplifier, a times 16 amplifier, a times 64 amplifier, a times 256 amplifier, a times 1024 amplifier, a times 4096 amplifier and a times 16,384 amplifier. These amplifications are possible by using a combination of four amplifiers stages as shown. From the rear-end of the amplifier, the last stage 32 is a times 4 amplifier, the next to last stage 34 is a times 16 amplifier, the second stage 36 is a times 16 amplifier and the first stage 38 is also a times 16 amplifier. Hence, unity gain can be achievd by bypassing all amplifiers, times 4 amplification can be achieved by selecting or connecting in amplifier 32 only, times 16 amplification can be achieved by connecting in amplifier 34 only, times 64 amplification can be achieved by connecting in amplifiers 34 and 32 together, times 256 amplification is achieved by connecting in amplifiers 36 and 34 together, times 1024 amplificatin is achieved by connecting in amplifiers 36, 34 and 32 together, times 4096 amplification is achieved by connecting the amplifiers 38, 36 and 34 together and times 16,384 amplification is achieved by connecting all four amplifiers together.

The lowest value of amplificatin is first applied to the signal, which effectively connects the output sample-and-hold 30 into the selected one of sample-and-hold circuits 40 and 42 as determined by logic control network 44. The output of sample-and-hold circuit 40 or 42 is applied through isolation amplifier 46 to comparator 48. The other input to comparator 48 is from amplifier 26. Amplifier 26 receives its input from digital-to-analog converter 24 which receives sequencing of input digital values as determined by microprocessor 14. If the data value from amplifier 46 is less than a given threshold which is predetermined for operation, typically so that the selected amplifiers are operating at 75% of full range amplificatin, then each time the reference value to the comparator reaches one of the critical numbers, namely 4, 16, 64, 256, 1024, 4096 and 16,384, the combination of cascaded amplifiers is changed to connect the selected amplifiers into service, as discussed above, thereby boosting the data signal applied to the comparator.

This selection procedure is accomplished by way of gain multiplexer 50, which has an input from the input of each of the amplifier stages. The data from sample-and-hold network 30 is applied to the cascaded stages. Microprocessor 52 sequentially operates gain select device 54 so as to produce sequential gain connections of amplifier stages 32, 34, 36 and 38, as previously discussed. As these connections are made, the amplitude conditions are applied to gain multiplexer 50, whose output is applied to gain word controller 56. When the corrections are such so as to produce an output from gain multiplexer 50 above a predetermined threshold level, an output from controller 56 stops further gain select sequencing and another output to microprocessor 14 is produced to store the gain word as the multiplier for the related data mantissa. The data signal duly amplified by the selected amplifier stages in accordance with the above procedure is applied to either sample-and-hold network 40 or 42 as alternately selected by logic switching network 44. It is this value that becomes the mantissa value portion of the signal. Alternate output sample-and-hold network selection permits faster overall operation of the circuit. The operation of the cascaded amplifiers to an eventual value is permitted while connected to one of these networks, while the other is being operated in its held condition with respect to comparator operations.

The output from amplifier 46 is therefor a result of the value on either sample-and-hold network 40 or 42 is applied to comparator 48 as the "reference" signal thereto. The other input to comparator 48 is from amplifier 26, which is an ever-increasing ramp-like signal produced in a manner explained below. When the two inputs are equal, then there is an output from analog-to-digital device 58 as produced by comparator 48.

The input to digital-to-analog device 24 from the microprocessor is a clocking of digital values. For each successively higher digital input value, there is a successively higher analog output value. Hence, the output is not a true ramp, but a stair-step ramp.

When there is an output from analog-to-digital device 58 to microprocessor 14, then gain select operation from microprocessor 14 to device 24 just described is terminated and the value is digitally stored or transferred within the microprocessor. At the same time, the gain word which is related thereto is transmitted or processed in accordance with procedures well known in the art.

The operation of the multiplexer is such that channel 1 is sampled in a preferred operating mode for 52.1 microseconds. Offset sample-and-hold network 22 applies an input to summation network 20 that was determined during the previous sampling of offset used by channel 1. During the sample portion of the sample-and-hold cycles for network 30, signal development and applications of input to network 22 occurs from networks 24 and 26, which are operated in a time sharing manner with the operation of analyzing data in the amplifier stages, no data then being analyzed.

Channel 2 is next loaded into the circuit that has just been described and so forth through the eight input channels.

Finally, controller 16 operates multiplexer 12 so as to select an input ground for amplifier 18. This effectively removes the output from the summation circuit 20. At the same time offset sample-and-hold network is controlled so there is no input therefrom to summation network 20. Hence, again theoretically, there is no input stored on sample-and-hold network 30. Nevertheless, the selection process is allowed to operate for each of the possible gain words for the cascaded amplifiers in the manner previously described. For each possible combination there is a gain word produced from gain mutliplexer 50 and controller 56, which is applied to microprocessor 14 for application through digital-to-analog converter device 24 to offset sample-and-hold network 22 when it is appropriate for operation with the next data input channel selections.

The above discussion is actually a simplified version of actual operation since is assumes that no preamplifier is connected into the circuit preceding the amplifier stages. However, it should be noted that preamplifier 10 also includes devices which develop offset. Individual values are determined therefor in the same manner as described above for the floatingd point amplifier stages. These offset values are added to the offset values determined in the above manner in the microprocessor so that the correction of total offset is accomplished by operation of offset sample-and-hold circuit, rather than merely compensation for offset of the cascaded amplifiers themselves offset voltages developed in a portion of the apparatus where the input signal can not be grounded can be determined by obtaining an average signal level for a sampled signal.

From the foregoing it will be seen that this invention is one well adapted to attain all of the ends and objects hereinabove set forth, together with other advantages which are obvious and which are inherent to the apparatus and structure.

It will be understood that certain features and subcombinations are of utility and may be employed without reference to other features and subcombinations. This is contemplated by and is within the scope of the claims.

Because many possible embodiments may be made of the invention without departing from the scope thereof, it is to be understood that all matter herein set forth and shown in the accompanying drawings is to be interpreted as illustrative and not in a limiting sense.

What is claimed is:

1. An instantaneous floating point amplifier, comprising
   an analog signal input summation network for receiving analog data signals,
   synchronized means for storing a predetermined value of offset voltage said synchronized means coupled to said analog signal input summation network for effectively subtracting an offset voltage component from said analog data signals,
   a sample-and-hold network coupled to receive an output signal from said summation network,
   cascaded amplifier means coupled to said sample-and-hold network for developing an analog mantissa value for said sampled-and-held data and a digital gain word related thereto, and
   an analog-to-digital converter coupled to said cascaded amplifier means for converting said analog mantissa value to a digital mantissa value, which, with said digital gain word, represents in digital form said sample analog data.

2. An instantaneous floating point amplifier in accordance with claim 1 for predetermining said offset value for said analog data signals, comprising
   switching means for grounding the input of said analog signal summation network for a period of time while said summation network is disconnected from said synchronized means,
   an output signal from said analog-to-digital converter producing an output signal representative of the existing offset voltage value, and
   said synchronized means including a digital storage means for storing said value of offset voltage in digital form as the predetermined value for subsequent connection to said analog signal input summation network.

3. An instantaneous floating point amplifier in accordance with claim 1, wherein said synchronized means includes
   digital storage means for storing a predetermined value of offset voltage in digital form, and
   a digital-to-analog converter for changing said predetermined value of offset voltage to an analog value for connection to said analog input summation network.

4. An instantaneous floating point amplifier in accordance with claim 3, and including
   a microprocessor for controlling a selection from a plurality of input data signals and for controlling a sampling period of said analog data and for controlling the selection of said predetermined value of offset from said digital storage means.

5. An instantaneous floating point amplifier with claim 4, wherein
   said microprocessor controls the period of said sample-and-hold network.

6. An instantaneous floating point amplifier in accordance with claim 4, and including
   a multiplexer coupled to receive a multichannel input data stream said multiplexer coupled to said microprocessor,
   said microprocessor sequencing said multiplexer to sequentially sample said plurality of input data signals from individual channels of data in said data stream for operational connection to said analog signal input summation network, and
   said microprocessor respectively sampling from said digital storage means corresponding offset values for each of said sequentially sampled input data signals.

7. An instantaneous floating point amplifier in accordance with claim 1, wherein said analog-to-digital converter includes
   a second sample-and-hold network for storing the analog mantissa voltage value from said cascaded amplifier means,
   a comparator for comparing the sampled-and-held analog mantissa value with a progressively larger analog voltage until the values match, and
   digital-to-analog means for producing said analog voltage and a corresponding digital value for storing as a measure of said matched analog mantissa value.

8. An instantaneous floating point amplifier in accordance with claim 7, wherein said digital-to-analog converter includes time sharing means for selectively converting to an analog voltage said digital offset voltage corresponding to one of said plurality of input data signals from said synchronized means and coupling said analog voltage to said analog input summation network, and for subsequently producing said analog voltage for said comparator.

9. An instantaneous floating point amplifier in accordance with claim 7, and including
a third sample-and-hold network for alternately storing with said second sample-and-hold network sequentially sample analog mantissa voltage values from said cascaded amplifier means.

10. An instantaneous floating point amplifier in accordance with claim 1, wherein said cascaded amplifier means includes
an output level sensor for determining when the analog mantissa output value from the final stage of said cascaded amplifier means is greater than a predetermined threshold value, and
gain select means connected to each stage of said cascaded amplifier means for sequentially switching in additional combinations of stage thereof until said sensor senses an output greater than said predetermined threshold value, said gain select means also producing a digital gain word output representative of the amplifier combination needed to produce an analog mantissa output value greater than said predetermined threshold value.

11. An instantaneous floating point amplifier in accordance with claim 10, and including
microprocessor switching means for grounding an input signal to said analog signal input summation network for a period of time while said analog signal input summation network is disconnected from said synchronized means,
said analog-to-digital converter producing sequential outputs respectively representative of the existing offset voltage values for each possible operating combination of stages of said cascaded amplifier means,
said synchronized means including digital storage means for storage said offset voltage values.

12. An instantaneous floating point amplifier in accordance with claim 11, and including
offset means for combining each of said offset voltage values in said storage means with an independently determined additional offset voltage values in said input data signals.

13. An instantaneous floating point amplifier in accordance with claim 11, and including
offset means for combining with each of said offset voltage values in said storage means an additional offset voltage values.

14. An instantaneous floating point amplifier in accordance with claim 11, and including
a multiplexer coupled to receive a multichannel input data stream and coupled to said microprocessor switching means,
said microprocessor switching means sequencing said multiplexer to sequentially sample input data signals from individual channels of data in said data stream for operational connection to said analog signal input summation network,
said microprocessor switching means respectively returning from said digital storage means corresponding offset voltage values for each sequentially sampled channel data as determined for the combination of stages therefor employed in said cascaded amplifier means.

15. An instantaneous floating point amplifier in accordance with claim 14, wherein said analog-to-digital converter includes
a second sample-and-hold network for storing the analog mantissa voltage value from said cascaded amplifier means,
a comparator for comparing the sampled-and-held analog mantissa value with a progressively larger reference analog voltage until the values match, and
digital-to-analog means for producing said reference analog voltage and a corresponding digital value for storing as a measure of said matched analog mantissa value.

16. An instantaneous floating point amplifier in accordance with claim 15, wherein said digital-to-analog means includes time sharing means
for selectively converting to an analog voltage said digital offset voltage corresponding to said input sampled data from said synchronized means and connecting it to said input summation network and
for subsequently producing said reference analog value for said comparator.

17. An instantaneous floating point amplifier in accordance with claim 16, and including
a third sample-and-hold network for alternatively storing with said second sample-and-hold network sequentially sampled analog mantissa values from said cascaded amplifier means.

18. An instantaneous floating point amplifier comprising:
input means for combining at least one data signal and an offset signal;
a plurality of amplifiers coupled to said input means for receiving said combined data and offset signal;
control means for configuring said plurality of amplifiers in configurations having a pre-established gain, said control means coupled to said input means for coupling an offset signal of said amplifier configurations.

19. The instantaneous floating point amplifier of claim 18 wherein said control means includes apparatus for storing another offset signal and gain value for selected amplifier configurations, said other offset signals determined when said combined signal is essentially zero.

20. The instantaneous floating point amplifier of claim 18 wherein said control means includes apparatus for storing a dc offset value for each data signal, said dc offset value determined by an average value for said data signal.

21. An instantaneous floating point amplifier comprising:
at least one input signal channel;
combining means for providing a combined signal including said input signal and an offset signal;
a plurality of amplifiers;
control means for configuring said plurality of amplifiers in configurations having predetermined gains; and,
offset means for coupling an offset signal to said combining means, said offset signal determined by an amplifier configuration output signal for a predetermined input signal and an amplifier configuration gain signal.

22. The instantaneous floating point amplifier of claim 21 wherein said offset means further includes means for determining a channel offset signal for a preselected channel, said channel offset signal resulting from an average value of said input signal when said offset signal is present, said offset means further including means for combining said offset signal and said channel offset signal to provide a combined offset signal for application to said combining means.

23. An instantaneous floating point amplifier comprising:
at least one input signal source;
combining means for combining said input signal and an offset signal into a combined signal;
a plurality of amplifiers of receiving said combined signals;
control means for configuring said plurality of amplifiers into a multiplicity of amplifier configurations, each of said configurations having a predetermined gain associated therewith; and
offset means for storing an error signal and a gain signal for said amplifier configurations, said control means combining said error signal and said gain signal to provide said offset signal for said amplifier configurations.

24. The instantaneous floating point amplifier of claim 23 wherein said offset means further includes an input signal error signal for each input signal, said input signal error signal combined with said error signal and said gain signal to provide said offset signal.

25. The method for correcting offset error voltages in an instantaneous floating point amplifier comprising the steps of:
in an amplifier having a plurality of gain configurations, measuring and storing an amplifier error signal for each amplifier gain configuration when a preselected signal is applied to said amplifier;
selecting an amplifier gain configuration;
combining an input data signal and an error signal for said selected gain configuration; and
applying said combined signal to said amplifier.

26. The method for correcting offset error voltages in an instantaneous float point amplifier of claim 25 further including the steps of:
determining a dc offset voltage for an input data signal from an average output signal from said amplifier in response to said combined signals;
combining said dc offset signal and said error signal.

* * * * *